(12) United States Patent
Abraham et al.

(10) Patent No.: US 10,734,567 B2
(45) Date of Patent: *Aug. 4, 2020

(54) BUMP BONDED CRYOGENIC CHIP CARRIER

(71) Applicant: International Business Machines Corporation, Armonk, NY (US)

(72) Inventors: David W. Abraham, Croton, NY (US); John M. Cotte, New Fairfield, CT (US); Mary B. Rothwell, Ridgefield, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/233,873

(22) Filed: Dec. 27, 2018

(65) Prior Publication Data

US 2019/0131509 A1    May 2, 2019

Related U.S. Application Data

(63) Continuation of application No. 15/721,087, filed on Sep. 29, 2017.

(51) Int. Cl.
*H01L 39/02* (2006.01)
*H01L 23/00* (2006.01)
(Continued)

(52) U.S. Cl.
CPC ............ *H01L 39/02* (2013.01); *H01L 23/473* (2013.01); *H01L 23/49888* (2013.01);
(Continued)

(58) Field of Classification Search
CPC ....... H01L 39/02; H01L 39/12; H01L 39/223; H01L 39/2406; H01L 39/2493;
(Continued)

(56) References Cited

U.S. PATENT DOCUMENTS 4,731,577 A    3/1988 Logan
5,041,699 A    8/1991 Soliday
(Continued)

FOREIGN PATENT DOCUMENTS

FR    2984602 A1    6/2013
JP    0312941 A    1/1991
(Continued)

OTHER PUBLICATIONS

Aliane, "Developpement de bolometre refroidi a 0,1 K pour une detection X dans la gamme 100 eV—10 keV. Theses pour obtenir le grade de docteur de l'Insti tut Polytechnique de Grenoble", May 25, 2009, pp. 114-126, XP055055684.
(Continued)

*Primary Examiner* — David C Spalla
(74) *Attorney, Agent, or Firm* — Erik K. Johnson (57) ABSTRACT

A device has a first stack of thin films, the first stack of thin films having a first opposing surface and a first connection surface, wherein the first connection surface contacts a first superconducting region; a second stack of thin films, the second stack of thin films having a second opposing surface and a second connection surface, wherein the second connection surface contacts a second superconducting region; and a superconducting bump bond electrically connecting the first and second opposing surfaces, the superconducting bump bond maintaining a low ohmic electrical contact between the first and second opposing surfaces at temperatures below 100 degrees Kelvin, wherein at least one of the first or second superconducting regions comprise material with a melting point of at least 700 degrees Celsius.

20 Claims, 7 Drawing Sheets

(51) Int. Cl.
  *H01L 39/12* (2006.01)
  *H01L 39/22* (2006.01)
  *H01L 39/24* (2006.01)
  *H01L 23/473* (2006.01)
  *H01L 23/498* (2006.01)

(52) U.S. Cl.
  CPC .............. *H01L 24/03* (2013.01); *H01L 24/05* (2013.01); *H01L 24/16* (2013.01); *H01L 24/81* (2013.01); *H01L 39/12* (2013.01); *H01L 39/223* (2013.01); *H01L 39/2406* (2013.01); *H01L 39/2493* (2013.01); *H01L 24/11* (2013.01); *H01L 24/13* (2013.01); *H01L 2224/0381* (2013.01); *H01L 2224/0401* (2013.01); *H01L 2224/05023* (2013.01); *H01L 2224/05111* (2013.01); *H01L 2224/05173* (2013.01); *H01L 2224/05176* (2013.01); *H01L 2224/05179* (2013.01); *H01L 2224/05568* (2013.01); *H01L 2224/05583* (2013.01); *H01L 2224/05609* (2013.01); *H01L 2224/05639* (2013.01); *H01L 2224/05644* (2013.01); *H01L 2224/05647* (2013.01); *H01L 2224/05664* (2013.01); *H01L 2224/05666* (2013.01); *H01L 2224/05669* (2013.01); *H01L 2224/05671* (2013.01); *H01L 2224/05673* (2013.01); *H01L 2224/05676* (2013.01); *H01L 2224/05684* (2013.01); *H01L 2224/1181* (2013.01); *H01L 2224/1308* (2013.01); *H01L 2224/13023* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/16014* (2013.01); *H01L 2224/16148* (2013.01); *H01L 2224/16225* (2013.01); *H01L 2224/81801* (2013.01); *H01L 2924/014* (2013.01); *H01L 2924/201* (2013.01); *H01L 2924/2064* (2013.01); *H01L 2924/20104* (2013.01)

(58) Field of Classification Search
  CPC ....... H01L 27/18; H01L 29/437; H01L 24/03; H01L 24/11; H01L 24/16; H01L 24/81
  See application file for complete search history.

(56) References Cited

U.S. PATENT DOCUMENTS

| | | | |
|---|---|---|---|
| 5,049,978 A | 9/1991 | Bates | |
| 5,138,436 A | 8/1992 | Koepf | |
| 5,255,158 A | 10/1993 | Kosugi | |
| 5,455,876 A | 10/1995 | Hopfer | |
| 5,773,875 A | 6/1998 | Chan | |
| 5,847,929 A | 12/1998 | Bernier | |
| 5,877,560 A | 3/1999 | Wen | |
| 6,216,941 B1 | 4/2001 | Yokoyama | |
| 6,239,703 B1 | 5/2001 | Friedman | |
| 6,250,933 B1 | 6/2001 | Khoury | |
| 6,434,016 B2 | 8/2002 | Zeng | |
| 6,457,979 B1 | 10/2002 | Dove | |
| 6,678,540 B2 | 1/2004 | Wire | |
| 6,809,524 B1 | 10/2004 | Sadler | |
| 6,894,582 B2 | 5/2005 | Whybrew | |
| 7,075,171 B2 | 7/2006 | Hato | |
| 7,915,981 B2 | 3/2011 | Snodgrass | |
| 8,159,825 B1 | 4/2012 | Dotsenko | |
| 8,338,286 B2 | 12/2012 | Perfecto | |
| 8,508,043 B2 | 8/2013 | Daubenspeck | |
| 8,871,631 B2 | 10/2014 | Lamprecht | |
| 9,836,699 B1 | 12/2017 | Rigetti | |
| 9,971,970 B1 | 5/2018 | Rigetti | |
| 10,068,181 B1 | 9/2018 | Rigetti | |
| 10,199,553 B1 | 2/2019 | Oliver | |
| 2004/0037062 A1 | 2/2004 | Sweeney | |
| 2007/0013581 A1 | 1/2007 | Iijima | |
| 2007/0040565 A1 | 2/2007 | Jayabalan | |
| 2007/0054510 A1 | 3/2007 | Price | |
| 2007/0205479 A1 | 9/2007 | Dangel | |
| 2008/0260327 A1 | 10/2008 | Liao | |
| 2009/0072393 A1 | 3/2009 | Bachman | |
| 2009/0267201 A1 | 10/2009 | Chang | |
| 2010/0047971 A1 | 2/2010 | Hua | |
| 2010/0109052 A1 | 5/2010 | Nakajima | |
| 2010/0163292 A1 | 7/2010 | Tsai | |
| 2010/0163296 A1 | 7/2010 | Ko | |
| 2010/0187688 A1 | 7/2010 | Hochstenbach | |
| 2011/0051375 A1 | 3/2011 | Ammar | |
| 2011/0133337 A1 | 6/2011 | Shau | |
| 2012/0175769 A1 | 7/2012 | Pendse | |
| 2012/0299170 A1 | 11/2012 | Kehrer | |
| 2013/0249095 A1 | 9/2013 | Shen | |
| 2014/0035609 A1 | 2/2014 | Huang | |
| 2014/0246763 A1 | 9/2014 | Bunyk | |
| 2014/0364015 A1 | 12/2014 | Sherrer | |
| 2015/0145108 A1 | 5/2015 | Yap | |
| 2015/0380343 A1 | 12/2015 | Koontz | |
| 2016/0049723 A1 | 2/2016 | Baks | |
| 2016/0197400 A1 | 7/2016 | Zimmerman | |
| 2016/0341790 A1 | 11/2016 | Thompson | |
| 2016/0352023 A1 | 12/2016 | Dang | |
| 2017/0133336 A1 | 5/2017 | Oliver | |
| 2017/0365574 A1 | 12/2017 | Abraham | |
| 2017/0373044 A1 | 12/2017 | Das | |
| 2018/0012932 A1 | 1/2018 | Oliver | |
| 2018/0102470 A1* | 4/2018 | Das | H01L 23/49888 |
| 2018/0366634 A1 | 12/2018 | Mutus | |
| 2019/0103541 A1 | 4/2019 | Abraham | |

FOREIGN PATENT DOCUMENTS

| | | |
|---|---|---|
| JP | 08204244 A | 8/1996 |
| WO | 2017079417 A1 | 5/2017 |
| WO | 2017105524 A1 | 6/2017 |
| WO | 2017131831 A2 | 8/2017 |

OTHER PUBLICATIONS

Aliane. Developpement de bolometre refroidi a 0, 1 K pour une detection X dans la gamme 100 eV—10 keV. Theses pour obtenir le grade de docteur de l'Institut Polytechnique de Grenoble; Theses l'Institut Polytechnique de Grenoble, May 25, 2009, 207 pages.

D. K. Brock, "RSFQ technology: Circuits and systems." International Journal of High Speed Electronics and Systems, vol. 11, No. 01, 2001, pp. 307-362.

Final Office Action for U.S. Appl. No. 15/721238 dated Jan. 24, 2019, 30 pages.

International Search Report and Written Opinion for International Application No. PCTIEP2017/080882 dated Jul. 13, 2018, 16 pages.

International Search Report for International Application No. PCT/EP2017/081722 dated May 6, 2018, 3 pages.

K. E. Yokoyama et al., "Robust superconducting die attach process." IEEE Transactions on Applied Superconductivity, vol. 7, No. 2, 1997, pp. 2631-2634.

Non-Final Office Action for U.S. Appl. No. 15/721,238 dated Jun. 17, 2018, 26 pages.

Non-Final Office Action for U.S. Appl. No. 16/233,852 dated Apr. 30, 2019, 16 pages.

Non-Final Office Action for U.S. Appl. No. 16/233,873 dated Apr. 4, 2019, 12 pages.

Robust Superconducting Die Attach Process.

RSFQ Technology: Circuits and Systems.

IBM: List of IBM Patents or Patent Applications Treated As Related (Appendix P), Nov. 21, 2019, 2 pages.

Final Rejection Office Action for U.S. Appl. No. 15/184,187 dated Mar. 26, 2019, 8 pages.

(56) References Cited

OTHER PUBLICATIONS

Final Rejection Office Action for U.S. Appl. No. 15/184,187 dated Sep. 29, 2017, 13 pages.
Morgan, et al., "A millimeter-wave perpendicular coax-to-microstrip transition," IEEE MTT-S International Microwave Symposium, 2002, vol. 2, pp. 817-820.
Non-Final Office Action for U.S. Appl. No. 15/184,187 dated Apr. 18, 2017, 3 pages.
Non-Final Office Action for U.S. Appl. No. 15/184,187 dated Aug. 1, 2018, 16 pages.
Non-Final Office Action for U.S. Appl. No. 15/184,187 dated Jan. 15, 2020, 10 pages.
Nartenberg, et al., "A coaxial-to-microstrip transition for multilayer substrates," IEEE Transactions on Microwave Theory and Techniques, vol. 52, No. 2, 2004, pp. 584-588.

* cited by examiner

FORM A FIRST PLURALITY OF THIN FILMS, THE FIRST PLURALITY OF THIN FILMS CHARACTERIZED BY HAVING A FIRST OPPOSING SURFACE AND A FIRST CONNECTION SURFACE, WHERE THE FIRST CONNECTION SURFACE IS IN PHYSICAL CONTACT WITH A FIRST SUPERCONDUCTING REGION 502

FORM A SECOND PLURALITY OF THIN FILMS, THE SECOND PLURALITY OF THIN FILMS CHARACTERIZED BY HAVING A SECOND OPPOSING SURFACE AND A SECOND CONNECTION SURFACE, THE FIRST AND SECOND OPPOSING SURFACES BEING OPPOSITE ONE ANOTHER, WHEREIN THE SECOND CONNECTION SURFACE IS IN PHYSICAL CONTACT WITH A SECOND SUPERCONDUCTING REGION 504

JOIN THE FIRST AND SECOND OPPOSING SURFACES WITH A SOLDER MATERIAL SUCH THAT THE SOLDER MATERIAL ELECTRICALLY CONNECTS THE FIRST AND SECOND OPPOSING SURFACES, THE SOLDER MATERIAL CHARACTERIZED BY MAINTAINING A LOW OHMIC ELECTRICAL CONTACT BETWEEN THE FIRST AND SECOND OPPOSING SURFACES AT TEMPERATURES BELOW 100 DEGREES KELVIN, WHEREIN THE FIRST AND SECOND SUPERCONDUCTING REGIONS ARE COMPRISED OF MATERIALS THAT HAVE A MELTING POINT OF AT LEAST 700 DEGREES CELSIUS 506

BUMP BONDED CRYOGENIC CHIP CARRIER

BACKGROUND

The present invention relates in general to connecting electrical signals into and out of a circuit. More specifically, the present invention relates to systems, methodologies and resulting bump-bonded interfaces configured to execute the direct transfer of electronic signals into and out of cryogenic electronics in a manner that eliminates the need for intermediary electrical connection mechanisms such as wire bond connections, and the like.

Electronic components may be connected together through different techniques. One such method is through wire bonding. Wire bonding is a well-known technique for forming electrical interconnections between an electronic component (e.g., a printed circuit board (PCB), a packaged or unpackaged integrated circuit (IC), etc.) and other components (e.g., external components, card sockets, microwave connectors, chip carriers, etc.). In wire bonding, a length of small diameter soft metal wire (e.g., gold (Au), copper (Cu), silver (Ag), aluminum (Al), and the like) is attached or bonded without the use of solder to a compatible metallic surface or pad mounted on a PCB or an IC/chip carrying substrate. The actual bond between the wire and the pad can be formed in a variety of ways, including the use of thermo-compression, thermo-sonic and ultrasonic techniques.

Components such as IC/chip carriers can be designed to reliably operate under a variety of conditions, including, for example, cryogenic conditions. The term "cryogenics" refers generally to the branches of physics and engineering that involve the study of very low temperatures, how to produce them, and how materials behave at those temperatures. The term "reliability" is used in electronics to describe the probability that a component operating under specified conditions will perform satisfactorily for a given period of time. Although wire bonding is widely used in the fabrication of electronic systems, the additional wire bond hardware, particularly in cryogenic electronic applications, is manually intensive to fabricate, suffers from low temperature CTE (coefficient of thermal expansion) mismatches, is difficult to reliably repeat, causes signal path problems, increases costs, adds bulk and in the case of microwave/radio frequency (RF) introduces extraneous microwave cavity modes.

SUMMARY

Embodiments of the invention are directed a device. Non-limiting examples of the device include a first plurality of thin films, the first plurality of thin films characterized by having a first opposing surface and a first connection surface, wherein the first connection surface is in physical contact with a first superconducting region. The device includes a second plurality of thin films, the second plurality of thin films characterized by having a second opposing surface and a second connection surface, the first and second opposing surfaces being opposite one another, wherein the second connection surface is in physical contact with a second superconducting region. Also, the device includes a solder material electrically connecting the first and second opposing surfaces, the solder material characterized by maintaining a low ohmic electrical contact between the first and second opposing surfaces at temperatures below 100 degrees Kelvin, wherein the first and second superconducting regions are comprised of materials that have a melting point of at least 700 degrees Celsius.

Embodiments of the invention are directed a device. Non-limiting examples of the device include a first plurality of thin films in physical contact with a first substrate at a first superconducting region, the first plurality of thin films characterized by having a first opposing surface and a first connection surface, wherein the first connection surface is in the physical contact with the first superconducting region. The device includes a second plurality of thin films in physical contact with a second substrate at a second superconducting region, the second plurality of thin films characterized by having a second opposing surface and a second connection surface, the first and second opposing surfaces being opposite one another, wherein the second connection surface is in the physical contact with the second superconducting region. Also, the device includes a solder material electrically connecting the first and second opposing surfaces, the solder material characterized by maintaining a low ohmic electrical contact between the first and second opposing surfaces at temperatures below 100 degrees Kelvin, wherein the first and second superconducting regions are comprised of materials that have a melting point of at least 700 degrees Celsius.

Embodiments of the invention are directed to a system. Non-limiting examples of the system include a cooling system and a device in the cooling system. The device includes a first plurality of thin films, the first plurality of thin films characterized by having a first opposing surface and a first connection surface, wherein the first connection surface is in physical contact with a first superconducting region. The device includes a second plurality of thin films, the second plurality of thin films characterized by having a second opposing surface and a second connection surface, the first and second opposing surfaces being opposite one another, wherein the second connection surface is in physical contact with a second superconducting region. Also, the device includes a solder material electrically connecting the first and second opposing surfaces, the solder material characterized by maintaining a low ohmic electrical contact between the first and second opposing surfaces at temperatures below 100 degrees Kelvin, wherein the first and second superconducting regions are comprised of materials that have a melting point of at least 700 degrees Celsius.

Embodiments of the invention are directed to a method of configuring a device. Non-limiting examples of the method include forming a first plurality of thin films, the first plurality of thin films characterized by having a first opposing surface and a first connection surface, wherein the first connection surface is in physical contact with a first superconducting region. The method includes forming second plurality of thin films, the second plurality of thin films characterized by having a second opposing surface and a second connection surface, the first and second opposing surfaces being opposite one another, wherein the second connection surface is in physical contact with a second superconducting region. Also, the method includes joining the first and second opposing surfaces with a solder material such that the solder material electrically connects the first and second opposing surfaces, the solder material characterized by maintaining a low ohmic electrical contact between the first and second opposing surfaces at temperatures below 100 degrees Kelvin, wherein the first and second superconducting regions are comprised of materials that have a melting point of at least 700 degrees Celsius.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this detailed description includes a description of attaching a specific type of electronic connector and interconnect structure on a substrate, implementation of the teachings recited herein are not necessarily limited to a particular type of connector, transmission architecture, circuit, or substrate. Rather embodiments of the present invention are capable of being implemented in conjunction with any other type of connector, transmission architecture, circuit, or substrate now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the described embodiments of the present invention are not intended to be limiting in this respect. Accordingly, a connection of entities can refer to either a direct or an indirect connection, and a positional relationship between entities can be a direct or indirect positional relationship. As an example of an indirect positional relationship, references in the detailed description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (i.e., rotated 90 degrees or at other orientations), and the spatially relative descriptors used herein should be interpreted accordingly.

For the sake of brevity, conventional techniques related to electronic device and IC fabrication may or may not be described in detail herein. Moreover, the various tasks and process steps described herein can be incorporated into a more comprehensive procedure or process having additional steps or functionality not described in detail herein. In particular, various steps in the manufacture of electronic devices and ICs are well known and so, in the interest of brevity, many conventional steps will only be mentioned briefly herein or will be omitted entirely without providing the well-known process details.

Turning now to an overview of aspects of the present invention, embodiments of the invention provide systems that can be used in various applications, such as in cryogenic electronics. In embodiments of the invention, a merged fabrication process is used to form two different types of electrical connections onto a first substrate. The first substrate may be comprised of just a carrier material. Examples of carrier materials can include ceramics, silicones, plastics, semiconductors, insulators, polymers, glass, metamaterials, composites, biomaterials, metals, PCB materials, and the like. The first substrate may or may not also include electronic circuitry. The electronic circuitry may either be fabricated on the surface of the carrier material, may be fabricated or integrated within the carrier material, or may be bonded to the carrier material. Examples of electrical components can include: capacitors, inductors, resistors, resonators, filters, lumped element systems, waveguides, Josephson junctions, ground planes, diodes, transistors, etc. In some embodiments of the invention, two different types of electrical connections are described. These electrical connections include connections to electronic connectors and connections to a second substrate through bump bonds. In another embodiment of the invention, a merged fabrication process that attaches the above two different types of connections through an interconnect structure is described. The interconnect structure can be a conductive material formed on the first substrate. The electronic connectors and the bump bonds connect to the interconnect substructure.

The bump bonds are formed from a low temperature solder material and provided with a size and/or shape that enables an electrical connection to be made at the point of contact. Examples of a low temperature solder material include: indium, indium tin alloys, indium bismuth alloys, SnAgCu alloy (also referred to as SAC), indium-bismuth-tin, lead-based solders (such as, for example, PbSn), etc.

The bump bond may be utilized to mechanically and electrically connect an electronic connector to the first substrate. Examples of electronic connectors can include any conventional or fabricated surface mounted connector configured to pass a range of electrical signals, such as direct current (DC) signals and/or radio frequency (RF) signals (i.e. low frequency RF signals, microwave signals, etc.).

The bump bonds may be utilized to mechanically and electrically connect the first substrate to a second substrate. The second substrate may be comprised of just a carrier material. Examples of carrier materials can include ceramics, silicones, plastics, semiconductors, insulators, polymers, glass, metamaterials, composites, biomaterials, metals, PCB materials, and the like. The second substrate may or may not also include electronic circuitry. The electronic circuitry may either be fabricated on the surface of the carrier material, may be fabricated or integrated within the carrier material, or may be bonded to the carrier material. Examples of electrical components can include: capacitors, inductors, resistors, resonators, filters, lumped element systems, waveguides, Josephson junctions, ground planes, diodes, transistors, etc.

The bump bonds, used to connect both the electronic connector to the first substrate and connect the first and second substrates together, may be formed simultaneously. By using the same solder material (having the same melting point) to form the bumps bonds for connecting the electronic connectors and connecting the first and second substrates, the need for a solder hierarchy is avoided. Solder hierarchies apply multiple different soldering methodologies tailored to the melting points and other characteristics of the different types of solder under use. By avoiding solder hierarchies, all solder bonds may be formed at the same time (i.e., simultaneous soldering).

In embodiments of the invention, a first under-bump-metallization (UBM) structure can be utilized to connect to a first interconnect structure on the first substrate and a second UBM structure can be utilized to connect to a second interconnect structure on the second substrate. The first UBM structure can include a first stack of materials and the second UBM structure can include a second stack of materials. In some embodiments of the invention, the first stack of materials and the second stack of materials can be the same. In other embodiments of the invention, the first stack of materials and the second stack of materials can be different. Furthermore, some layers in the first and second stacks may be comprised of different materials and some may be comprised of the same materials.

The interconnect structure (or interconnect layer) can take a variety of forms, including, for example, metal on film, damascene metal, diffusion or any other type of conductive contact area on the first substrate. The interconnect structure may either comprise a physically contiguous structure on the surface of the substrate or may comprise several structures that are physically separate from one another on the surface of the substrate. Additionally, portions of the interconnect structure may also be located within the substrate. The first UBM structure and solder attachment methodology may be utilized to physically secure and electrically connect an electronic connector directly to the first interconnect structure on the first substrate. The material properties of the first stack of materials in the first UBM structure are tailored to the specific joining method and material of the bump bond and the interconnect structure. In embodiments of the invention, the first interconnect structure on the first substrate can electrically connect the electronic connector to electronic circuitry on the first substrate and/or on the second substrate. Accordingly, embodiments of the present invention avoid the manually intensive fabrication, low temperature CTE mismatches, lack of repeatability, signal path problems, increased cost, added bulk and extraneous microwave cavity modes introduced by routing electronic signals through intermediary connection mechanisms such as PCBs and wire bond connections.

In some embodiments of the invention, the second interconnect structure on the second substrate is electrically and/or physically connected to the first substrate (e.g., through the first interconnect structure on the first substrate) through the bump bonds and the second UBM structure using flip chip fabrication. The above-described "merged" fabrication process for forming two different types of electrical connections (i.e., surface mounted connectors and bonding together of the first and second substrates) on the first substrate can utilize a modified version of flip chip fabrication. To bond the second substrate through the bump bond, more traditional flip chip fabrication can be used. Accordingly, electrical connections are provided through the electronic connector, the first interconnect structure on the first substrate, the first UBM structure on the first interconnect structure, the bump bonds, the second UBM structure on the second interconnect structure, and the second interconnect structure on the second substrate.

In some embodiments, the bump bonds not only provide the electrical connection between the first and second substrates, the bump bonds also provide thermal conduction through the first and second substrates, and act as spacers to prevent electrical shorts and provide mechanical support. The bump bonds also avoid wire bonding and therefore are able to be much smaller than their counterparts. The thickness of the metal films that form the UBM stack of materials (e.g., first and second UBM structures) can be thin films, and therefore can be selected to be sufficiently thin (e.g., under 3 micrometers ($\mu$m) each) such that the metal films become superconducting because they are in sufficient proximity to the bump bonds. In addition, the bump bonds can be formed from superconducting materials such as, for example: indium, indium tin alloys, indium bismuth alloys, SnAgCu alloy (also referred to as SAC), indium-bismuth-tin, lead-based solders (such as, for example, PbSn), etc. In this way, a superconducting connection can be formed between the interconnect structures on the first and second substrates. The size (e.g., diameter) of the bumps can be selected to be sufficiently large to allow greater than 50 micrometers of spacing between the first substrate (i.e., the interposer) and the second substrate in order to minimize capacitive loading effects between the first and second substrates.

Embodiments of the invention are to be utilized to electrically and mechanically bond electronic components to substrates and/or interconnect structures using a first UBM structure and a second UBM structure. Embodiments of the inventions may be described as being used with a chip carrier for explanation purposes. It should be appreciated that embodiments of the invention are not limited to use with a chip carrier.

Figure 1A:
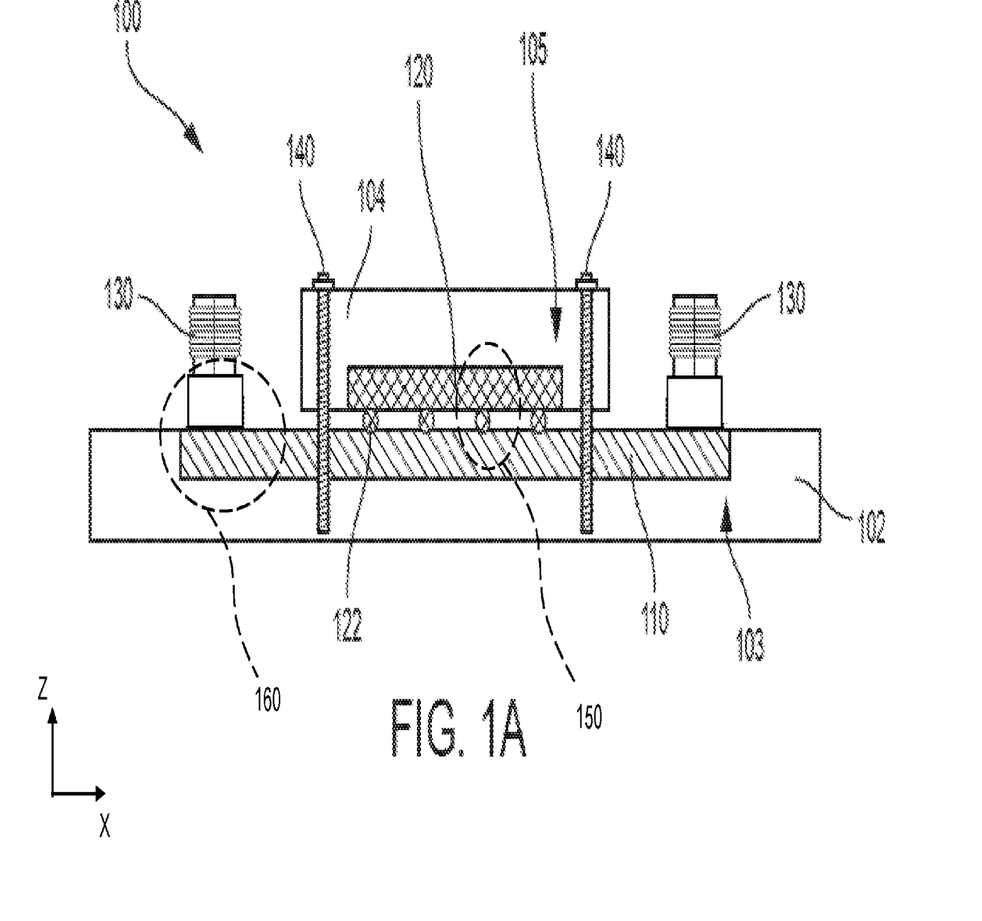
FIG. 1A depicts a cross-sectional view of a bump-bonded cryogenic electronic carrier having microwave connectors according to embodiments of the invention.

Turning now to a more detailed description of aspects of the invention, FIG. 1A depicts a cross-sectional view of a chip carrier 100 that houses a bump-bonded cryogenic electronic device. The chip carrier 100 can include a bottom housing 102, a top housing 104, a first substrate 110, a second substrate 120, and one or more electronic connectors 130 all of which are configured and arranged as shown in FIG. 1A. In embodiments of the invention, the first substrate 110 is in a first cavity 103 of the bottom housing 102. In some embodiments of the invention, the second substrate is in a second cavity 105 of the top housing 104. In some embodiments of the invention, the first substrate 110 is not in the bottom housing 102, and/or the second substrate 120 is not in the top housing 104. In some embodiments of the invention, there is no bottom housing 102 and/or top housing 104.

In embodiments of the invention, the bottom housing 102 and the top housing 104 can be formed from copper (Cu). In some embodiments of the invention, the bottom housing 102 and top housing 104 can be formed of some other suitable materials, such as a thermally conductive material or an insulating crystal. In embodiments of the invention, the bottom housing 102 and the top housing 104 are physically coupled together by screws 140. It is noted that the screws 140 are positioned at the edges of the top and bottom housings 104, 102 such that the screws 140 extend through the top and bottom housings 104, 102 but do not extend through the first substrate 110. In forming the embodiments of the invention shown in FIG. 1A, the screws should not be tightened so much that the too much pressure is applied to the bumps 122, which can result in the bumps 122 being deformed, which can degrade signal performance. In some embodiments, there are no screws 140 that are used in assembly 100.

Figure 2:
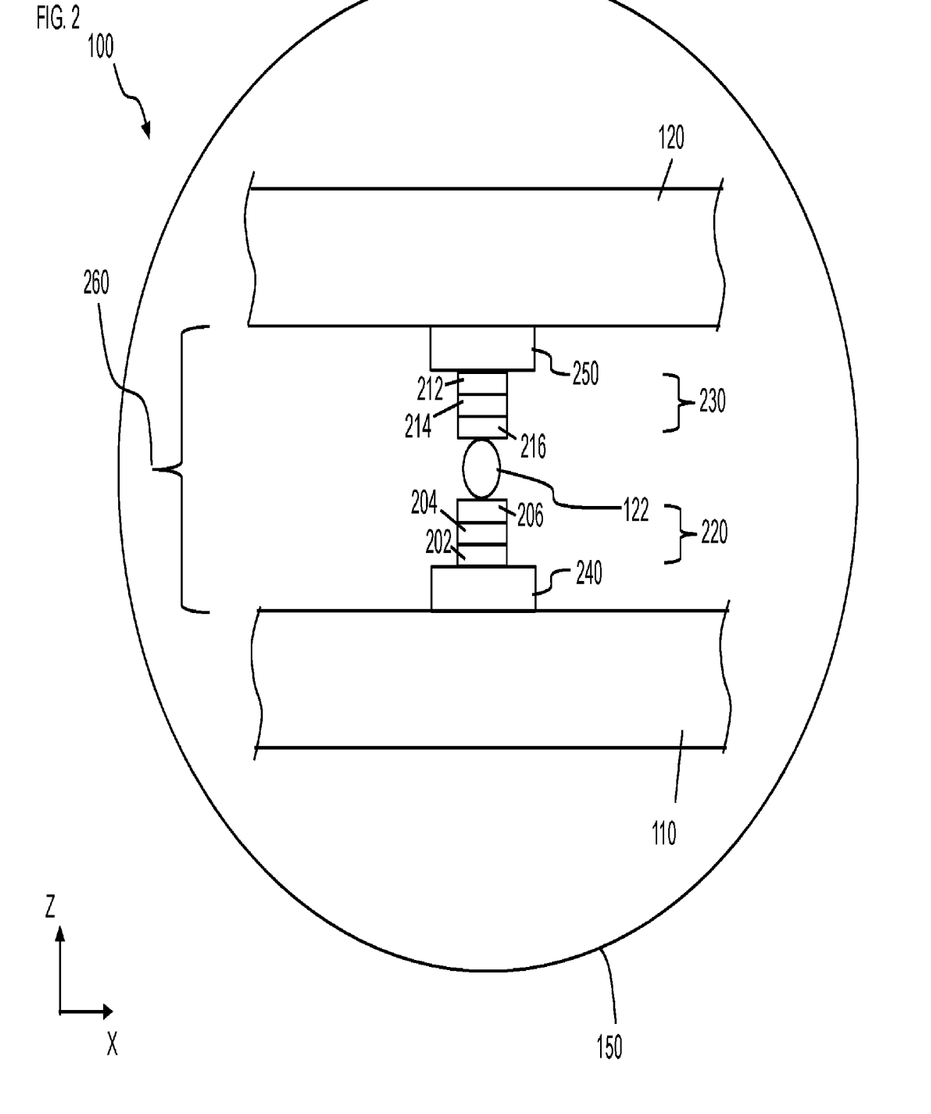
FIG. 2 depicts an enlarged view of a portion of the cryogenic electronic carrier according to embodiments of the invention.

The second substrate 120 can be electrically and/or physically connected to the first substrate 110 through bump bonds 122 having under-bump-metallurgy (e.g., UBM structures 220 and 230 shown in FIG. 2). For ease of illustration, only one of the four bump bonds 122 shown in FIG. 1A is provided with a reference number. In embodiments of the invention, the bump bonds 122 are formed from low temperature solder. The low temperature solder are solders that are processed at temperatures below 300 degrees Celsius. The low temperature solder of the bump bonds 122 are superconducting materials. Examples of the superconducting materials for the low temperature solder can include indium, indium tin alloy, indium bismuth alloy, SnAgCu alloy (also referred to as SAC), indium-bismuth-tin, lead-based solders (such as, for example, PbSn), etc. Particularly, in one implementation, the low temperature solder is indium or indium based.

Figure 3:
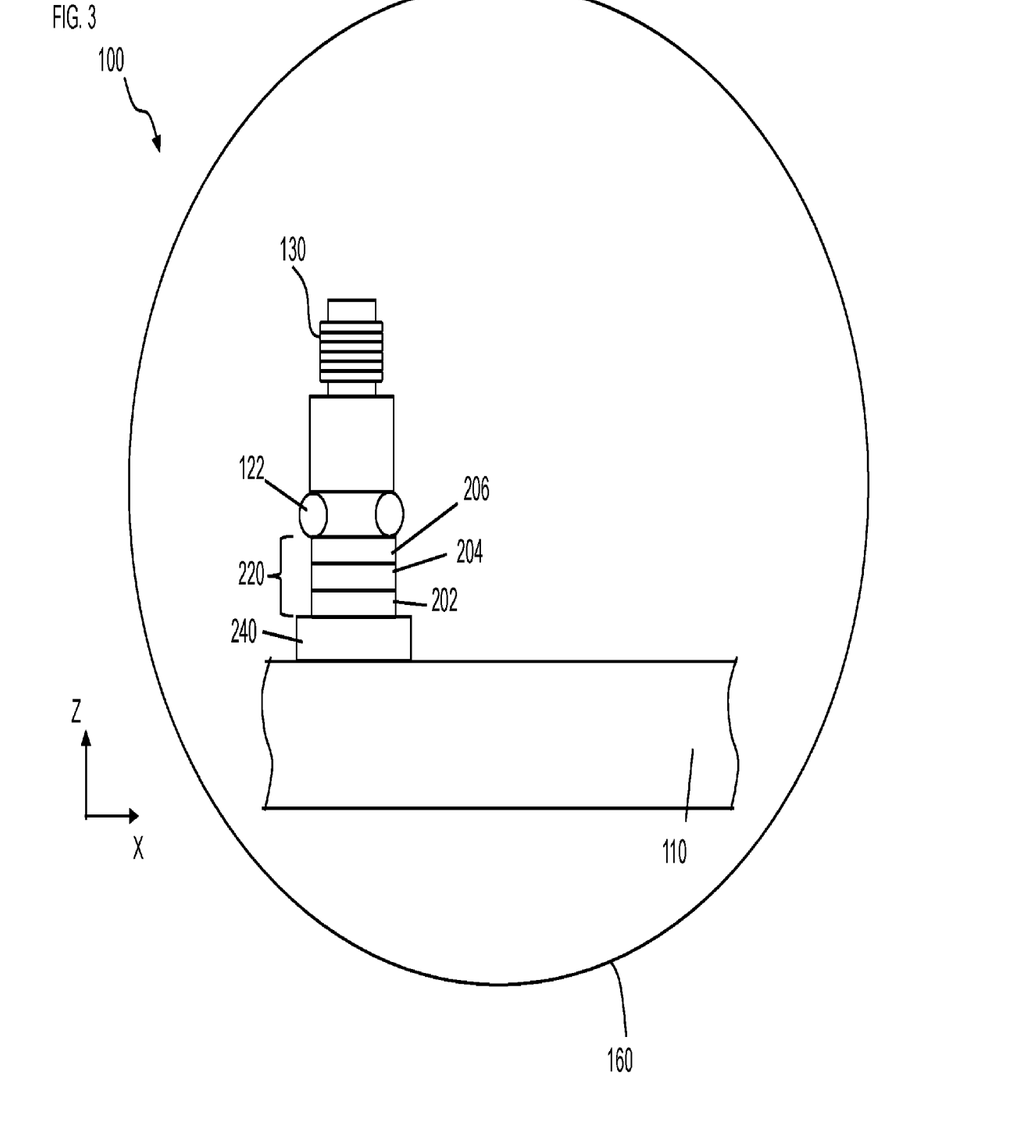
FIG. 3 depicts an enlarged view of a portion of the cryogenic electronic carrier according to embodiments of the invention.

The electronic connectors 130 can be electrically and physically connected to the first substrate 110 through bump bonds 122. The UBM structure 220 can be utilized to connect the electronic connectors 130 to the first substrate as shown in FIG. 3. In some embodiments of the invention, the electronic connector 130 is a conventional surface mounted microwave connector. In other embodiments, the electronic connector may be one of any conventional or fabricated surface mounted connector configured to pass a range of electrical signals, such as direct current (DC) signals and/or radio frequency (RF) signals (i.e., low frequency RF signals, microwave signals, etc.).

The first substrate 110 and second substrate 120 can be comprised of a carrier material. Examples of carrier materials can include: ceramics, silicones, plastics, semiconductors, insulators, polymers, glass, metamaterials, composites, biomaterials, metals, PCB materials, and the like. The first substrate 110 and second substrate 120 can also include electronic circuitry. The electronic circuitry may either be fabricated on the surface of the carrier material, may be fabricated or integrated within the carrier material, or may be bonded to the carrier material. Examples of electrical components can include: capacitors, inductors, resistors, resonators, filters, lumped element systems, waveguides, Josephson junctions, ground planes, diodes, transistors, etc.

Figure 1B:
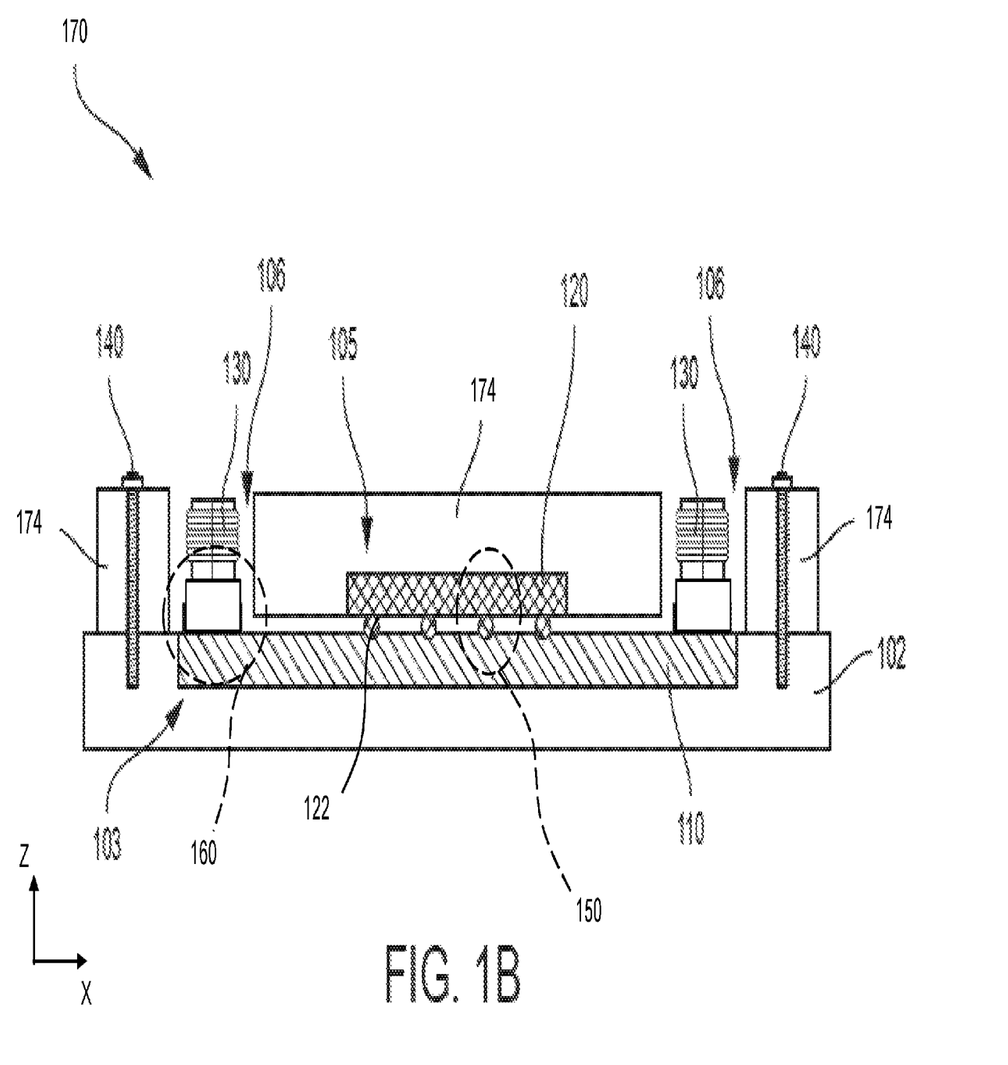
FIG. 1B depicts a cross-sectional view of a bump-bonded cryogenic electronic carrier having microwave connectors according to embodiments of the invention.

FIG. 1B depicts a cross-sectional view of a chip carrier 170 that houses a bump-bonded cryogenic electronic device according to embodiments of the invention. The chip carrier 170 shown in FIG. 1B is substantially the same as the chip carrier 100 shown in FIG. 1A except the chip carrier 170 includes a top housing 174 that extends further laterally than the top housing 104 shown in FIG. 1A and includes a third cavity 106 through which the electronic connectors 130 extend. In FIG. 1B, the top housing 174 fits against the bottom housing 102 at the edges thereof, and lateral portions of the top housing 174 are secured to the bottom housing 102 by the screws 140. To avoid the need to carefully avoid over-tightening the screws 140 to avoid damaging the bumps 122, the dimension of the top housing 174 and the first cavity 105 are selected to provide a space (not shown) between the second substrate 120 and the bottom housing 102 when edges of the lateral portions of the top housing 174 are flush against the edges of the bottom housing 102. As noted above, the housing is shown for completeness, and embodiments of the invention are not limited to use with a housing. For example, in some embodiments, there may be no screws 140 that are used in assembly 170.

FIG. 2 depicts an enlarged view of a portion of the chip carrier 100 according to embodiments of the invention. FIG. 2 illustrates the highlighted portion 150 in FIGS. 1A and 1B to further illustrate bonding of the first substrate 110 to the second substrate 120 using a first UBM structure 220 and a second UBM structure 230. The first substrate 110 has UBM structures 220 attached to a first interconnect structure 240 on the first substrate 110. The second substrate 120 has UBM structure 230 attached to a second interconnect structure 250 on the second substrate 120. It should be appreciated that the size of the UBM structures 220 and 230 and the size of the interconnect structures 240 and 250 are not drawn to scale and are shown larger (i.e., exaggerated) for ease of understanding.

The UBM structure 220 includes a first stack of materials and the UBM structure 230 includes a second stack of materials. The first stack of materials in UBM structure 220 and the second stack of materials in UBM structure 230 can include multiple layers of materials, particularly two or more layers. These materials can be thin films. In some embodiments, these materials are composed of metals. For explanation purposes and not limitation, the UBM structure 220 and UBM structure 230 are depicted as having a stack of three layers. The UBM structure 220 can include first layer 202, second layer 204, and third layer 206, although fewer or more layers can be utilized. For example, second layer 204 can be composed of multiple layers of materials, such as a multilayered thin film structure. The first layer 202 is in direct connect with the first interconnect structure 240 and the third layer 206 is in direct contact with the bump bond 122. The UBM structure 230 can include first layer 212, second layer 214, and third layer 216, although fewer or more layers can be utilized. For example, second layer 214 can be composed of multiple layers of materials, such as a multilayered thin film structure.

In embodiments of the invention, the layers 202, 204, 206 of UBM structure 220 can be different from the layers 212, 214, 216 of UBM structure 230. In other embodiments of the invention, the layers 202, 204, 206 of UBM structure 220 can be the same as the layers 212, 214, 216 of UBM structure 230. In some embodiments of the invention, some of the layers 202, 204, 206 of UBM structure 220 can be different from and some can be the same as the layers 212, 214, 216 of UBM structure 230.

The first layer 202 acts as an adhesion layer to provide a good mechanical attachment to the first interconnect structure 240 on the first substrate 110. The first layer 212 also acts as an adhesion layer to provide a good mechanical attachment to the second interconnect structure 250 of the second substrate 120. In some embodiments of the invention, example materials of the adhesion layer 202 and 212 can include Ti, W, Cr, etc.

The second layer 204 in UBM structure 220 and/or the second layer 214 in the UBM structure 230 is optional. Particularly, the second layer 204 is an intermediate layer in the UBM structure 220 and the second layer 214 is an intermediate layer in the UBM structure 230. The second layer 204 acts as an adhesion layer to provide a good mechanical attachment between the first layer 202 and the third layer 206. Likewise, the second layer 214 acts as an adhesion layer to provide a good mechanical attachment between the first layer 212 and the third layer 216. In this way, the second layer is only necessary if the first layers 202 and 212 and the third layers 206 and 216 do not adhere well to each other respectively. The second layer 204 and/or second layer 214 may also be multilayered in order to facilitate adhesion between materials used in the first layers 202 and 212 and in the third layers 206 and 216 that cannot adhere to each other through a single intermediate material layer. In some embodiments of the invention, there may not be a second layer 204 and/or second layer 214 since the materials used in the first layers 202 and 212 and third layers 206 and 216 might adhere to each other well. In embodiments of the invention, example materials of the optional second layer 204 and optional second layer 214 can include: Pd, Pt, Ag, Ru, Os, Rh, Cu, etc.

In both UBM structures 220 and 230, the third layer 206 and the third layer 216 are the bond layer. The third layer 206 bonds to the bump bond 122, while the third layer 216 bonds to the bump bond 122 from the opposite side. In some embodiments, the surface of the third layer 206 and/or 216 may be wettable to improve the bonding between the third layer 206 and/or 216 and the bump bond 122.

The third layer 206 and third layer 216 need to have the property of forming a good mechanical and electrical connection between the bump 122 and the underlying films, where the underlying films are layer 204 or layer 202 if optional layer 204 is not present in the UBM structure 220 and layer 214 or layer 212 if optional layer 214 is not present in the UBM structure 230. In embodiments of the invention, examples of the third layer 206 and third layer 216 can include Au, Pt, Pd, Ru, Os, Ag, Cu, etc., and alloys of the same. In embodiments of the invention, the third layer 206 can be comprised of materials that maintain a low ohmic electrical contact between the solder material 122 at temperatures below 100 degrees Kelvin. In embodiments of the invention, the third layer 216 can be comprised of materials that maintain a low ohmic electrical contact between the solder material 122 at temperatures below 100 degrees Kelvin. The third layer 206 and third layer 216 create a bond with the solder bump 122 (from opposite sides). The third layer 206 creates a metallic bond with the bump 122, and the strength of the bond can be partially attributed to diffusion that occurs between the materials of the bump 122 and third layer 206. The third layer 216 creates a metallic bond with the bump 122, and the strength of the bond can be partially attributed to diffusion that occurs between the materials of the bump 122 and third layer 216. Diffusion is the movement of atoms between the bonded materials. For example, the layers of the UBM structure 220 (and analogously UBM structure 230) become superconducting because the indium bump 122 above and the Ti film 202 below (both of which are superconducting) induce a non-zero superconducting order parameter to appear in the normal metal layer 206, thereby causing the entire stack of layers 202, 204, 206 to become superconducting. The same applies by analogy to layers 212, 214, 216 in the UBM structure 230).

The interconnect structure 240 on the first substrate 110 and the interconnect structure 250 of the second substrate 120 can take a variety of forms, including, for example, metal on film, damascene metal, diffusion or any other type of conductive contact area on the first substrate and second substrate. The interconnect structure 240 and/or interconnect structure 250 may either comprise a physically contiguous structure on the surface of their respective substrates 110 and 120, or may comprise several structures that are physically separate from one another on the surface of their respective substrates 110 and 120. Additionally, portions of the interconnect structure 240 and/or interconnect structure 250 may also be located within their respective substrates 110 and 120. The interconnect structure can be composed of a superconducting material, such as a superconducting metal or a superconducting ceramic. In some embodiments, the interconnect structure may comprise a superconducting material that has a melting point of at least 700 degrees Celsius such as Nb.

The interconnect structure 240 may serve as an interconnect layer which electrically connects electronic circuitry in substrate 110 to the outside world via electronic connectors 130. The interconnect structure 240 can also be an interface that connects to both the electronic connectors 130 and the interconnect structure 250.

The interconnect structure 240 and possibly layers 202 and/or 204 may be placed in direct contact with layer 206. When layer 206 is not a superconducting metal thin film, this physical contact allows for the superconducting order parameter in the superconducting films to induce a non-zero order parameter in the normal metal thin film 206, thereby causing it to become superconducting. Similarly, when a non-superconducting metal thin film is used for layer 216, interconnect structure 250 and possibly layers 212 and/or 214 will similarly cause layer 216 to become superconducting. The length scale of this decay is governed by the normal metal coherence length which depends on material properties and specifically on cleanliness of the interfaces and the material itself, where the material of the third layers 206 and 216 can be a metallic layer which has both material adhesion properties to the underlying films (i.e., 204 and 214 or 202 and 212 respectively) and the bump bond 122, plus the ability to be electrically conductive with low resistance. Typical normal metal materials that can be used here for the third layers 206 and/or 216 can include: Au, Ag, Ru, Os, Cu, etc. In one example, a normal metal film used for the third layer 206 can be as thick as 3 micrometers ($\mu m$) or as thin as 10 nanometers (nm), with the actual thickness chosen to provide strong adhesion and to cause the entire stack of layers 202 and 206 (and optionally layer 204) to become superconducting. Similarly, the normal metal film 216 can be as thick as 3 micrometers ($\mu m$) or as thin as 10 nanometers (nm) to cause the entire stack of layers 212 and 216 (and optionally layer 214) to become superconducting.

Becoming superconducting can also depend on the amount of current-carrying that is required to pass through interconnect structure 240 for UBM structure 220 and/or to pass through interconnect structure 250 for UBM structure 230. For very low-current applications, it is possible to tolerate a thicker layer 206 and/or thicker layer 216. For high current applications, the thickness of each layer 206 and layer 216 would be on the low end of the range of 50-100 nm. In embodiments of the invention, the stack of layer 202/204/206 and stack of layer 212/214/216 can each be Ti/Pd/Au. In other examples, the stacks can include other materials discussed herein, such as TiSnIn, TiPtTiPd, and WPtAu.

Further, third layer 206 and third layer 216 respectively become superconducting by proximity to the superconducting material of the bump bond 122. Particularly, having layer 206 and layer 216 become a superconducting material depends on having a sufficiently thin normal metal contact layer 206 and layer 216 to allow the superconductivity to extend across its thickness. As such, the thickness of each third layer 206 and third layer 216 should be below 3 μm In addition, care should be taken to prepare all interfaces (both above and below layer 206 and layer 216) to better facilitate superconductivity to occur. Being in proximity can mean that the third layer 206 can become a superconducting material when the third layer 206 comes in (direct) contact (i.e., physical contact) with a superconducting material, provided that the metallurgy and cleanliness of the material are sufficient to allow diffusion of the superconducting order parameter into the normal metal, such as when the third layer 206 bonds with the bump bonds 122 made of a superconducting material. Similarly, being in proximity can mean that the third layer 216 becomes a superconducting material when the third layer 216 comes in (direct) contact (i.e., physical contact) with a superconducting material, such as when the third layer 216 bonds with the bump bonds 122 made of a superconducting material. As shown in FIG. 2, the third layer 206 and third layer 216 of UBM structures 220 and 230 are in contact with the bump bonds 122. For example, when the bump bonds 122 are indium which is a superconducting material, the third layer 206 becomes a superconducting by its proximity to the indium bump bond 122, and likewise the third layer 216 becomes superconducting by its proximity to the indium bump bond 122. As explained previously, this effect is achieved because the physical contact allows for the superconducting order parameter in the superconducting films to induce a non-zero order parameter in the normal metal thin films 206 and/or 216, thereby causing it to become superconducting. By having the third layer 206 and the third layer 216 become a superconducting material when in contact with, for example, an indium bump bond 122, the connection of the respective UBM structures 230 and 240 to the bump bond 122 has zero resistance or nearly zero resistance.

In some embodiments of the invention, the third layer 206 and/or the third layer 216 can have a low resistance connection to the bump bond 122, where the low resistance connection is less than 1 ohm/contact with the bump bond 122. Low resistance connection can also be less than 1 micro-ohm/contact with the bump bond 122.

Additionally, to create a zero resistance or nearly zero resistance connection for signals transmitted back and forth between the UBM structure 230, the bump bonds 122, and the UBM structure 230 should be thin films. In some embodiments of the invention, the thickness of each layer 202, 204, 206 (which can be more or fewer layers as long as layer 202 and 206 are present) can be under 3 micrometers (μm) each. In some embodiments of the invention, the thickness of each layer 212, 214, 216 (which can be more or fewer layer as long as layer 212 and 216 are present) can be under 3 micrometers (μm) each.

The height of the bump bonds 122 for connecting the first and second substrate 110 and 120 together in FIG. 2 is designed to provide a predefined separation distance 260 in the z-axis. In embodiments of the invention, the separation distance 260 can be about equal to or greater than 30 micrometers (μm), about equal to or greater than 60 micrometers (μm), and/or about equal to or greater than 70 micrometers (μm). Before compression, examples of heights for the bump bonds 122 in the z-axis include about 100 micrometers (μm) or more, about 120 micrometers (μm) or more, etc. As one example, the height of the bump bonds 122 in FIG. 2 can be about 100 micrometers (μm) before compression to result in a separation distance 260 of about 60 micrometers (μm) or more between the first and second substrates 110 and 120. The predefined separation distances 260 discussed herein are technically beneficial because the separation distance helps to prevent electric fields from coupling between the first substrate 110 and the second substrate 120 and accounts for assembly sensitivity and variations. For example, the separation distance is sufficient to avoid capacitive coupling between electronic circuitry of substrate 110 and electronic circuitry of second substrate 120. The separation distance is sufficient to avoid/overcome (and be resistant to) issues associated with the surface of the first substrate 110 and the surface of the second substrate 120 not being positioned exactly parallel to each other. Thus, even if one substrate is tilted so as to have a surface that is not parallel with respect to the surface of the other substrate there will be none of the problems noted herein.

U.S. Pat. No. 7,075,171 to Hato describes the use of superconducting solder bumps bonded directly to superconducting interconnect lines of Nb. Unlike embodiments of the present invention described here, Hato does not disclose the unique separation distances and the height of solder bump bonds 122 between the first and second substrate 110 and 120 discussed herein. In addition, Hato does not describe or teach how one can bond a superconducting solder bond to a superconducting metal through a UBM adhesion structure 220 and 230 as described herein.

WIPO patent application having Publication No.: WO 2017/105524 A1 and International Application No.: PCT/US2015/068082 to Mutus describes solder bonding superconducting aluminum wires (transmission lines). The aluminum transmission lines have a problem when indium soldering makes material contact with it. Thus, Mutus describes forming an intermediate layer between the indium solder and the aluminum to prevent diffusion of the indium solder. Unlike Mutus, the embodiments of the present invention do not require a diffusion layer between the (layer 206 or layer 216) of the UBM structures 220 and 230 and the solder bump 122 and in fact promote diffusion to occur between the indium solder and the UBM structures 220 and 230.

FIG. 3 depicts an enlarged view of a portion of the chip carrier 100 that houses a bump-bonded cryogenic electronic device according to embodiments of the invention. FIG. 3 illustrates the highlighted portion 160 in FIGS. 1A and 1B. Similar to FIG. 2, the first substrate 110 has UBM structure 220 attached to the first interconnect structure 240. The electronic connectors 130 are directly attached to the top layer 206 of the UBM structure 220. It should be appreciated that the size of the UBM structure 220 is not drawn to scale and are shown larger for ease of understanding. The bump bonds 122 used to connect the electronic connectors 130 to the first interconnect 240 on the first substrate 110 can be the same as the bump bonds 122 used to connect the first and second substrates 110 and 120 together. Similarly, the height of the bump bonds 122 used to connect the electronic connectors 130 may be approximately the same as the height used to connect the first and second substrates 110 and 120 together. In embodiments of the invention, the bump bonds 122 for connecting the electronic connectors 130 to the substrate 110 through interconnect structure 240 and for connecting the first and second substrates 110 and 120 together are formed simultaneously. Also, the UBM structures 220 for attaching the electronic connectors 130 and for attaching the first substrate 110 to the bump bumps 122 through interconnect structure 240 can be formed simultaneously.

Additionally, as noted herein, the UBM structure 220 for attaching the electronic connectors 130 to the first substrate 110 in FIG. 3 can have more than three layers and/or two layers, such that the third layer 206 is attached to the bottom of the microwave connectors 130 and the first layer 202 is attached to the first interconnect structure 240 of first substrate 110.

Figure 4:
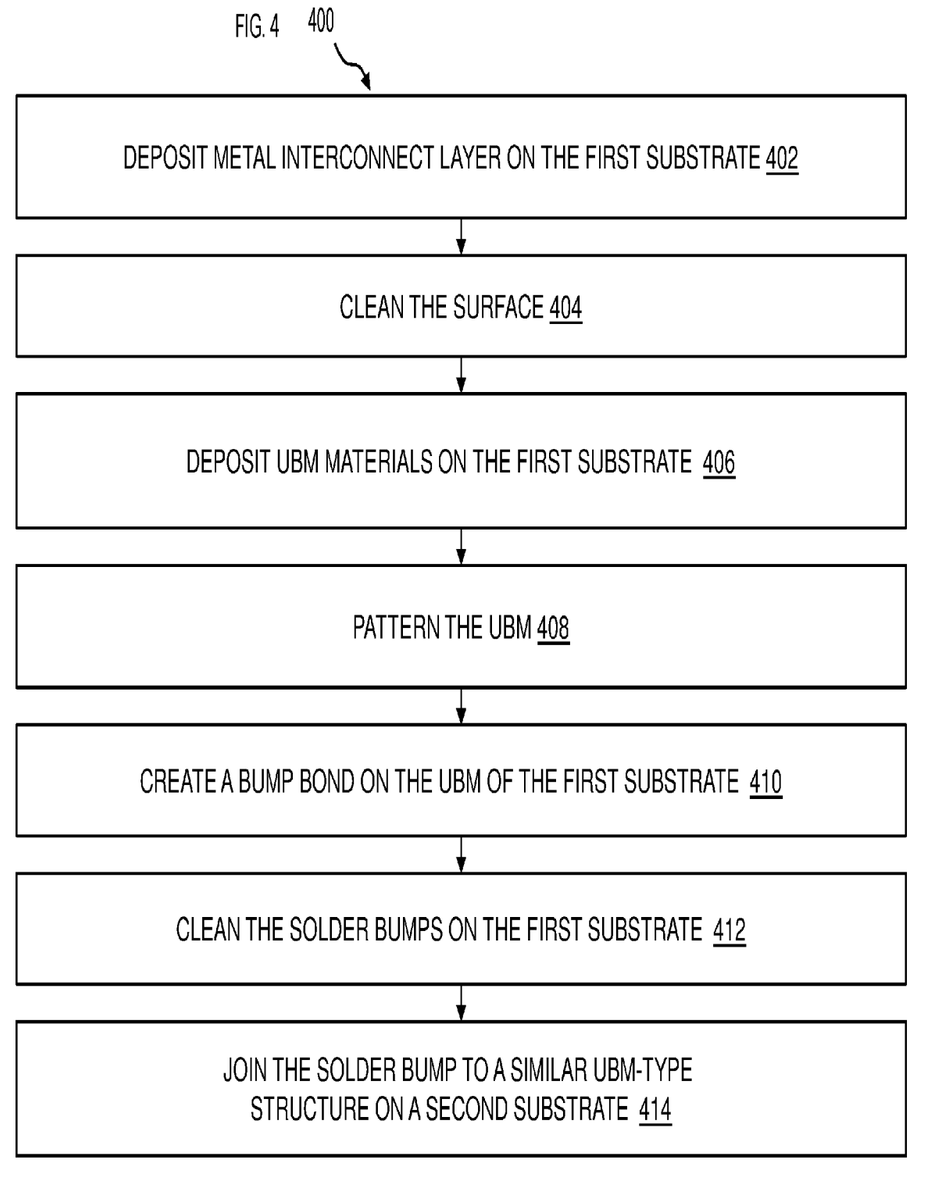
FIG. 4 is a flow chart of a method of forming a bump-bonded device according to embodiments of the invention.

FIG. 4 is a flow chart 400 of a method of forming a bump-bonded device 100 according to embodiments of the invention. The process flow includes depositing metal layers onto the first substrate 110 (which can be the first superconducting chip) so as to make the interconnect structure 240 at block 402. The metal layers can be formed by sputtering, evaporation, electroplating, direct bond (also referred to a lamination), etc. The metal layers can be deposited and patterned into the desired circuitry as understood by one skilled in the art.

At block 404, the surface is cleaned. The surface can be cleaned by laser assisted cleaning, plasma assisted cleaning, sputter cleaning, wet or vapor chemical cleaning, etc.

At block 406, the UBM materials (materials of UBM structure 220) are deposited on the interconnect structure 240 of the first substrate 110 in coordination with the previous or simultaneous cleaning of block 504. This means that some or all of the UBM materials are deposited quickly after the clean or in situ within the same cluster tool so that no further contamination occurs. Choice of UBM materials (such as, for example, layers 202, 204, 206) are dictated by diffusion properties and metallic bonding of various constituent layers. After depositing the UBM materials, a photoresist may be patterned over the deposited UBM materials in such a way as to define a future pattern of the first UBM structure 220 through the photoresist patterns that are left remaining.

Alternatively, in block 406, a photoresist is applied and patterned using standard photoresist processing over the interconnect structure 240 of the first substrate 110 in such a way as to define a future pattern of the first UBM structure 220 through open holes in the photoresist. Some or all of the UBM materials (materials of UBM structure 220) are deposited onto the patterned photoresist after the photoresist patterning has been completed. The UBM can then be formed through using a standard lift-off process used to pattern microelectronics. Choice of UBM materials (such as, for example, layers 202, 204, 206) are dictated by diffusion properties and metallic bonding of various constituent layers.

The UBM materials may be deposited through any number of standard deposition processes such as sputtering, evaporation, electroplating, direct bond (also referred to a lamination), etc. With respect to the deposition of the UBM materials, there may be no intermediary metal layers, such as no metal layer 204 (which can represent many layers), between the first layer 202 and the last layer 206. Optionally, a second layer 204 (or more layers) may be present in between the first and last layers 202 and 206.

At block 408, the UBM (e.g., first UBM structure 220) is patterned in order to restrict the area it occupies during or after the deposition process. The UBM (e.g., first UBM structure 220) can be patterned by various methods including liftoff, subtractive etch (wet, RIE, etc.,), and direct write using for example ion assisted deposition. Further, the last layer 206 can be formed using injection molding, but this could require more cleaning. For the other methods of depositing the layer 206, in situ cleans can be incorporated and the UBM top metal layer 206 can be chosen from a wider group of metals. For example, plating can be done with top metal layers 206 comprised of Al, Cu, Ru, Ni, and so on.

At block 410, a solder is deposited to create bump bond 122 on the UBM structures 220 of the first substrate 110. Before depositing the solder, the surface of layer 206 is cleaned as discussed above, for example, using laser assisted cleaning, plasma assisted cleaning, sputter cleaning, wet or vapor chemical cleaning, etc. The bump bond 122 can be created using standard methods for applying low temperature solder, such as, for example, mold backfill methods such as plating or injection molding, evaporation, and/or sputtering.

At block 412, the bump bonds 122 are cleaned. At this point, the second substrate 120 is not attached on the opposite end of the bump bonds 122. The bump bonds 122 are cleaned as discussed above, for example, using laser assisted cleaning, plasma assisted cleaning, sputter cleaning, wet or vapor chemical cleaning, etc. In addition, in a coordinated fashion with the cleaning of the bump bonds 122, the surface of the third layer 216 in UMB structure 230, which is located on interconnect structure 250 of the second substrate 120 is similarly cleaned using one of the cleaning techniques described above.

At block 414, shortly after the cleaning step of 412, the bump bonds 122 are bonded to second substrate 120 (e.g., which can be a second superconducting chip) through UBM structure 230. In this case, the UBM structure 230 is called bond metallurgy instead of UBM. Although the top layer 206 in the first substrate 110 and third layer 216 of the second substrate 120 may be the same in some cases, it is noted that the bond metallurgy on the second substrate 120 (second chip) can be relaxed. In such a case, relaxing the constraint on the bond metal layer 216 (for the second substrate 120) means it is possible to use flux or reducing gases during the bond procedure. This allows use of oxidizing or otherwise imperfectly clean metallic surfaces for this layer 216 of the second substrate 120.

Additionally, it should be noted that the bond is described by the pressing of the second substrate 120 (second chip) onto the bump bonds 122 (which are present on the first substrate 110) using a specific recipe of bond force and temperature as a function of time, as would be understood by one skilled in the art.

Also, there are other ways to perform this process. For example, the bumps 122 can initially start on either (chip) just reversing which chip is pressed onto which. That is, the bump bonds 122 can be on the UBM structure 230 of the second substrate 120 first. Then, the first substrate 110 can be pressed down on top of the second substrate 120. In addition, bump bonds 122 can be on both substrates and the bumps are then pressed on to each other. For example, bumps 122 can be on the UBM structures 220 and additional bumps 122 can be on the UBM structures 230. Accordingly, the first and second substrate 110 and 120 can be pressed together.

Figure 5:
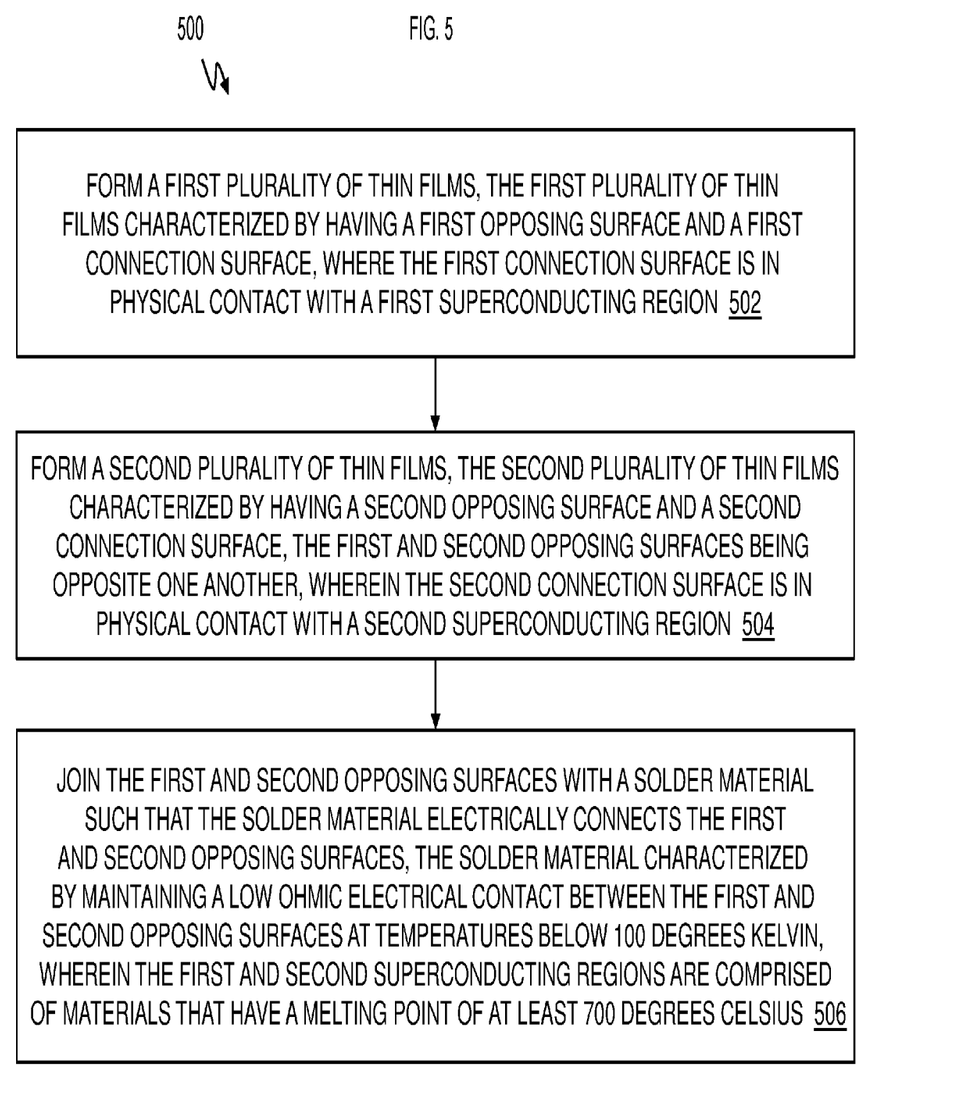
FIG. 5 depicts a flow chart of a method of forming a device according to embodiments of the invention.

FIG. 5 depicts a flow chart 500 of a method of forming a device 100 according to embodiments of the invention. At block 502, a first plurality of thin films (e.g., at least layers 202 and 206 in UBM structure 220) are formed, and the first plurality of thin films are characterized by having a first opposing surface (e.g., on layer 206 in UBM structure 220)

and a first connection surface (e.g., on layer 202 in UBM structure 220), where the first connection surface (e.g., film 202 in UBM structure 220) is in physical contact with a first superconducting region (interconnect structure 240).

At block 504, a second plurality of thin films (e.g., at least layers 212 and 216 in UBM structure 230) are formed, and the second plurality of thin films are characterized by having a second opposing surface (e.g., on layer 216 in UBM structure 220) and a second connection surface (e.g., on layer 212 in UBM structure 230). The first and second opposing surfaces (of, e.g., layer 206 in UBM structure 220 and layer 216 in UBM structure 230) are opposite one another, where the second connection surface (e.g., on layer 212 in UBM structure 230) is in physical contact with a second superconducting region (e.g., interconnect structure 250).

At block 506, a solder material (e.g., bump bond 122) electrically connects the first and second opposing surfaces (e.g., of layer 206 in UBM structure 220 and film 216 in UBM structure 230). The solder material is characterized by maintaining a low ohmic electrical contact between the first and second opposing surfaces at temperatures below 100 degrees Kelvin, where the first and second superconducting regions are comprised of materials (e.g., interconnect structure 240 and 250) that have a melting point of at least 700 degrees Celsius.

The first and second plurality of thin films are electrically conductive. The first plurality of thin films comprises a stack of films in which the stack of films is characterized as having a first opposing film (e.g., layer 206 of UBM structure 220) and a first connection film (e.g., layer 202 of UBM structure 220), where the first opposing film and the first connection film are positioned on opposite ends of the stack of films.

The first opposing film (e.g., layer 206 of UBM structure 220) is in physical contact with the solder material (e.g., bump bond 122) and the first connection film (e.g., layer 202 of UBM structure 220) is in physical contact with the first superconducting region (e.g., interconnect structure 240). The first opposing film is comprised of a first material and the first connection film is comprised of a second material, where the first and second materials are different from each other. The first and second materials are metals.

At least one intermediate film (e.g., layer 204 of UBM structure 220) is positioned between the first opposing film (e.g., layer 206 of UBM structure 220) and the first connection film (e.g., layer 202 of UBM structure 220). The at least one intermediate film (e.g., layer 204 of UBM structure 220) facilitates a mechanical bond between the first opposing film (e.g., layer 206 of UBM structure 220) and the first connection film (e.g., layer 202 of UBM structure 220). The at least one intermediate film is characterized as being a different material from the first opposing film and the first connection film. The at least one intermediate film is a metal. The first superconducting region (e.g., interconnect structure 240) is in contact with a first substrate (e.g., substrate 110) and the second superconducting region (e.g., interconnect structure 250) is in contact with a second substrate (e.g., substrate 120).

The solder material (e.g., bump bonds 122) has a height that causes a separation distance (e.g., separation distance 260) between the first and second substrates (e.g., substrates 110 and 120). The separation distance (e.g. separation distance 260) between the first and second substrates is selected from the group consisting of the separation distance of about or greater than 50 micrometers (μm), the separation distance of about or greater than 60 micrometers (μ), and the separation distance of about or greater than 70 micrometers (μm).

Figure 6:
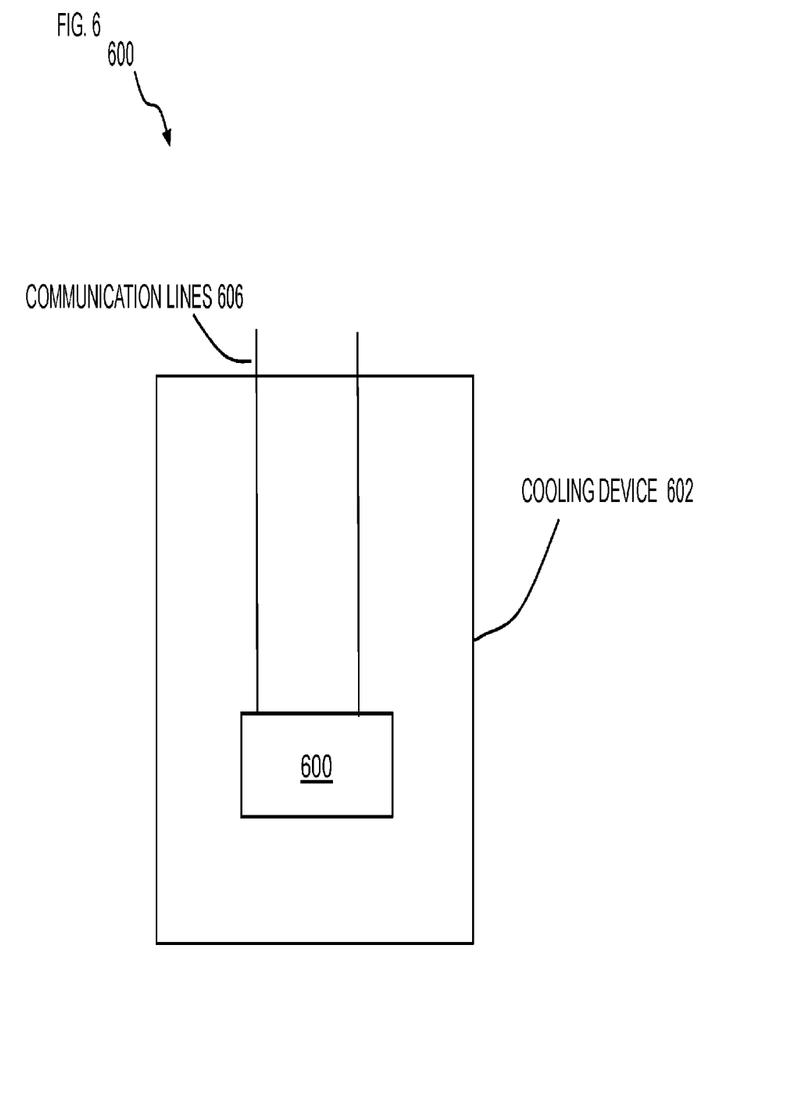
FIG. 6 depicts a system according to embodiments of the invention.

FIG. 6 depicts a system 600 in which the device 100 has been placed into a cooling system 602 according to embodiments of the invention. The system 600 shows that one or more input and output lines 606 are connected to the chip carrier 100 that houses the bump-bonded cryogenic electronic device structures in the cooling system 602. The cooling system 602 can be a cryogenic cooling device, dilution refrigerator, etc. The chip carrier 100 that houses the bump-bonded cryogenic electronic device is cooled to superconducting temperatures (low temperatures), such as below 100 millikelvin (mK), at about 10-100 mK, and/or about 4 K.

Thus, it can be seen from the foregoing detailed description and accompanying illustrations that embodiments of the present invention provide systems, methodologies and resulting chip carrier that houses the bump-bonded cryogenic electronic device structures configured to execute the direct transfer of electronic signals into and out of one or more circuits in a manner that eliminates the need for intermediary connection mechanisms such as PCBs, wire bond connections, and the like. In embodiments of the invention, a merged fabrication process is used to form two different types of electrical connections on a first substrate. In embodiments of the invention, the two different types of electrical connections includes electronic connectors (e.g., microwave connectors) and bump bonds, and the merged fabrication process attaches the two different types of connectors through an interconnect structure.

As previously noted herein, for the sake of brevity, conventional techniques related to circuits may or may not have been described in detail. By way of background, however, a more general description of the electrical device fabrication processes that can be utilized in implementing embodiments of the present invention will now be provided. Although specific fabrication operations used in implementing embodiments of the present invention may or may not be individually known, the disclosed combination of operations and/or resulting structures of the embodiments of the present invention are unique. Thus, the unique combination of the operations described in connection with the fabrication of a coupler system according to embodiments of the present invention utilize a variety of individually known physical and chemical processes performed on a substrate.

Fundamental to fabrication processes can be lithography, i.e., the formation of three-dimensional relief images or patterns on the substrate for subsequent transfer of the pattern to the substrate. In lithography, the patterns are a light sensitive polymer called a photoresist. To build the complex structures that make up a transistor and the many wires that connect the millions of transistors of a circuit, lithography and etch pattern transfer steps are repeated multiple times. Each pattern being printed on the substrate is aligned to the previously formed patterns and slowly the conductors, insulators and selectively doped regions are built up to form the final device.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. The described embodiments of the present invention has been presented for purposes of illustration and description, but is not intended to be exhaustive or limited to the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially" and equivalents thereof are intended to include the degree of error associated with measurement of the particular quantity based upon the equipment available at the time of filing the application. For example, "about," "substantially" and equivalents thereof can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such disclosed embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A device comprising:
   a first stack of thin films, the first stack of thin films having a first opposing surface and a first connection surface, wherein the first connection surface contacts a first superconducting region on a first substrate;
   a second stack of thin films, the second stack of thin films having a second opposing surface and a second connection surface, wherein the second connection surface contacts a second superconducting region on a second substrate;
   a third stack of thin films having a third opposing surface and a third connection surface, wherein the third connection surface contacts a third superconducting region on the first substrate, wherein the third superconducting region comprises one or more materials with a melting point of at least 700 degrees Celsius;
   a superconducting bump bond electrically connecting the first and second opposing surfaces, the superconducting bump bond maintaining a low ohmic electrical contact between the first and second opposing surfaces at temperatures below 100 degrees Kelvin, wherein at least one of the first or second superconducting regions comprise material with a melting point of at least 700 degrees Celsius; and
   a microwave connector connected to the third opposing surface with a solder material that maintains electrical connection between the third opposing surface and the microwave connector at temperatures below 100 degrees Kelvin.

2. The device of claim 1, wherein at least one of the first or second stack of thin films are electrically conductive.

3. The device of claim 1, wherein the first stack of thin films has a first opposing film and a first connection film, the first opposing film and the first connection film positioned on opposite ends of the stack of thin films.

4. The device of claim 3, wherein the first opposing film is in physical contact with the superconducting bump bond and the first connection film is in physical contact with the first superconducting region.

5. The device of claim 3, wherein the first opposing film is comprised of a first material, and the first connection film is comprised of a second material different from the first material.

6. The device of claim 5, wherein the first and second materials are metals.

7. The device of claim 5, wherein at least one intermediate film is positioned between the first opposing film and the first connection film, the at least one intermediate film facilitating a mechanical bond between the first opposing film and the first connection film, the at least on intermediate film is comprised of a third material selected from the group consisting of ruthenium, osmium, rhodium, or copper.

8. The device of claim 7, wherein the at least one intermediate film is a metal.

9. The device of claim 1, wherein the first superconducting region is in contact with a first substrate and first superconducting circuitry that is integrated with the first substrate, and the second superconducting region is in contact with a second substrate and second superconducting circuitry that is integrated with the second substrate.

10. The device of claim 9, wherein the superconducting bump bond has a height that causes a separation distance between the first and second substrates, wherein the separation distance between the first and second substrates is selected from the group consisting of: a separation distance of about or greater than 50 micrometers (μm), a separation distance of about or greater than 60 micrometers (μm), or a separation distance of about or greater than 70 micrometers (μm).

11. A device comprising:
a first stack of thin films having a first opposing surface and a first connection surface, wherein the first connection surface is in contact with a first superconducting region of a first substrate and first superconducting circuitry integrated with the first substrate;
a second stack of thin films having a second opposing surface and a second connection surface, wherein the second connection surface is in contact with a second superconducting region of a second substrate and second superconducting circuitry integrated with the second substrate;
a superconducting bump bond electrically connecting the first and second opposing surfaces, the superconducting bump bond maintaining a low ohmic electrical contact between the first and second opposing surfaces at temperatures below 100 degrees Kelvin, wherein at least one of the first or second superconducting regions comprise material having a melting point at or greater than 700 degrees Celsius; and
a microwave connector connected to a third opposing surface of a third stack of thin films that contacts a third superconducting region on the first substrate, wherein the third superconducting region comprises one or more materials with a melting point of at least 700 degrees Celsius and maintains electrical connection between the third opposing surface and the microwave connector at temperatures below 100 degrees Kelvin.

12. The device of claim 11, wherein the first and second stack of thin films are electrically conductive.

13. The device of claim 1, wherein the first stack of thin films has a first opposing film and a first connection film positioned on opposite ends of the stack of thin films.

14. The device of claim 13, wherein the first opposing film is in contact with the superconducting bump bond and the first connection film is in physical contact with the first superconducting region.

15. The device of claim 13, wherein the first opposing film comprises a first material, and the first connection film comprises a second material different from the first material.

16. The device of claim 15, wherein the first and second materials are metals.

17. The device of claim 15, wherein at least one intermediate film is positioned between the first opposing film and the first connection film, the at least one intermediate film facilitating a mechanical bond between the first opposing film and the first connection film, the at least on intermediate film is comprised of a third material selected from the group consisting of: ruthenium, osmium, rhodium, or copper.

18. The device of claim 17, wherein the at least one intermediate film is a metal.

19. A system comprising:
a cooling system that lowers temperature of the superconducting device to superconducting temperature, the superconducting device operating at the superconducting temperature, the superconducting device comprising:
a first stack of thin films, the first stack of thin films having a first opposing surface and a first connection surface, wherein the first connection surface contacts a first superconducting region on a first substrate;
a second stack of thin films, the second stack of thin films having a second opposing surface and a second connection surface, wherein the second connection surface contacts a second superconducting region on a second substrate;
a superconducting bump bond electrically connecting the first and second opposing surfaces, the superconducting bump bond maintaining electrical contact between the first and second opposing surfaces at temperatures below 100 degrees Kelvin, wherein at least one of the first or second superconducting regions comprise material with a melting point of at least 700 degrees Celsius; and
a microwave connector connected to a third opposing surface of a third stack of thin films that contacts a third superconducting region on the first substrate, wherein the third superconducting region comprises one or more materials with a melting point of at least 700 degrees Celsius and maintains electrical connection between the third opposing surface and the microwave connector at temperatures below 100 degrees Kelvin.

20. The system of claim 19, wherein the first and second stack of thin films are electrically conductive.

* * * * *